(12) United States Patent
Su et al.

(10) Patent No.: US 8,866,550 B2
(45) Date of Patent: Oct. 21, 2014

(54) AMPLIFIER CIRCUIT WITH OVERSHOOT SUPPRESSION

(75) Inventors: Chia-Wei Su, Hsinchu (TW); Ju-Lin Huang, Hsinchu County (TW); Keko-Chun Liang, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 13/339,373

(22) Filed: Dec. 29, 2011

(65) Prior Publication Data

US 2012/0119834 A1   May 17, 2012

Related U.S. Application Data

(63) Continuation of application No. 12/687,892, filed on Jan. 15, 2010, now Pat. No. 8,111,103.

(30) Foreign Application Priority Data

Oct. 29, 2009   (TW) .............................. 98136680 A (51) Int. Cl.
   H03F 3/45   (2006.01)
(52) U.S. Cl.
   USPC ........................................................ 330/255
(58) Field of Classification Search
   USPC ................... 330/253, 255, 262–265, 269
   See application file for complete search history.

(56) References Cited

U.S. PATENT DOCUMENTS

| | | | |
|---|---|---|---|
| 3,968,382 A * | 7/1976 | Tsurushima ................. | 330/264 |
| 4,274,059 A * | 6/1981 | Okabe ........................... | 330/266 |
| 4,370,623 A | 1/1983 | Nagasawa | |
| 4,442,409 A | 4/1984 | Preslar | |
| 4,965,464 A | 10/1990 | Von Basse et al. | |
| 5,216,382 A | 6/1993 | Ito | |
| 5,347,169 A | 9/1994 | Preslar et al. | |
| 5,365,194 A * | 11/1994 | Sands, Jr. ...................... | 330/253 |
| 5,731,692 A | 3/1998 | Garcia | |
| 6,097,237 A | 8/2000 | Singh | |

FOREIGN PATENT DOCUMENTS

| | | |
|---|---|---|
| EP | 2077615 | 8/2009 |
| EP | 2077615 A1 | 8/2009 |
| GB | 2121548 | 12/1983 |
| TW | 200307391 | 12/2003 |
| TW | 200737715 | 10/2007 |

OTHER PUBLICATIONS

"Office Action of Taiwan counterpart application" issued on Jan. 28, 2013, p. 1-p. 10.

(Continued)

*Primary Examiner* — Khanh V Nguyen
(74) *Attorney, Agent, or Firm* — Jianq Chyun IP Office (57) ABSTRACT

An amplifier circuit with overshoot suppress scheme including an input amplifier, an output amplifier, and a diode is provided. A first and a second input ends of the output amplifier are coupled to a differential output pair of the input amplifier. The diode is coupled between an output end and the first input end of the output amplifier. When the voltage difference between the output and the input ends of the output amplifier is greater then the barrier voltage of the diode, the diode is turned on, so that the output end of the output amplifier is coupled to the input end of the output amplifier. In the transient state, it rapidly smoothes the overshoot signal. In the steady state, the diode is cut off to maintain the normal operation of the operational amplifier.

23 Claims, 5 Drawing Sheets

(56) References Cited

OTHER PUBLICATIONS

"First Office Action of China counterpart application" issued on May 4, 2012, p. 1-p. 4.

Behzad Razavi, "Design of Analog CMOS Integrated Circuits," Aug. 15, 2000, pp. 256-258.

"Office Action of Taiwan Counterpart Application", issued on Oct. 21, 2013, p. 1-p. 16.

B. Razavi, "Design of Analog CMOS Integrated Circuits," Aug. 15, 2000, pp. 1-3.

"Office Action of Taiwan Counterpart Application", issued on May 22, 2014, p. 1-p. 9.

* cited by examiner

AMPLIFIER CIRCUIT WITH OVERSHOOT SUPPRESSION

CROSS-REFERENCE TO RELATED APPLICATION

This application is a continuation application of and claims the priority benefit of patent application Ser. No. 12/687,892, filed on Jan. 15, 2010, now allowed. The prior patent application Ser. No. 12/687,892 also claims the priority benefit of Taiwan application No. 98136680, filed on Oct. 29, 2009. The entirety of each of the above-mentioned applications is hereby incorporated by reference herein and made a part of this specification.

BACKGROUND OF THE INVENTION

1. Field of the Invention

The invention relates to an amplifier circuit, and more particularly to an amplifier circuit with an overshoot suppress scheme.

2. Description of Related Art

In the signal process and control system, the amplifier circuit is usually used to adjust, transmit, enhance, or reduce signals. The amplifier has a plurality of types. According to the application and the bandwidth requirement of the used amplifier, it can be divided into the power amplifier, the tuning amplifier, the input stage amplifier, and the output stage amplifier.

For the conventional amplifier, when it outputs the output signal, the overshoot may occur in the output signal during the dynamic operation due to the phase margin, the insufficient area, and so on. The overshoot represents that, in the circuit, the transient instant voltage can not be immediately stabilized and is much greater than the steady voltage during the period of the converting state. When the signal is outputted, it will cause the signal to be unstable. Accordingly, the back circuit to receive the signal may operate abnormally, and even the circuit is burned out. However, in many applications, a steady output voltage is needed, and the problem that the voltage is raised in a very short time must be suppressed within a tolerable scope.

In the prior art, by designing a larger phase margin, the dynamic response becomes slower to suppress the overshoot, and for different conditions, such as the process, the voltage, and the process-voltage-temperature variation (PVT variation), the phase margins in different conditions are much different, so that it is required to change the design of the circuit according to different conditions. Other methods, such as the method of speeding the change of the transient state by increasing the current, or the method of adding capacitors in the output end to reduce the amplitude of the oscillation and stabilize the output voltage, also increase the fabricating coat and the circuit area.

SUMMARY OF THE INVENTION

An embodiment of the invention provides an amplifier circuit with an overshoot suppress scheme. By a diode device, the overshoot is rapidly stabilized in the transient state, and in the steady state, the diode device is cut off to maintain the normal operation of the amplifier circuit, thereby suppressing the overshoot.

An embodiment of the invention provides an amplifier circuit including an input amplifier, an output amplifier, and a first diode device. The input amplifier has a first input end, a second input end, and a differential output pair. The output amplifier has a first input end, a second input end, and an output end. The first and the second input ends of the output amplifier are coupled to the differential output pair of the input amplifier. The first diode device is coupled between the output end of the output amplifier and the first input end of the output amplifier. When a voltage difference between the output end of the output amplifier and the first input end of the output amplifier is greater than a barrier voltage of the first diode device, the first diode device is turned on.

In an embodiment of the invention, the first diode device includes a diode. An anode of the diode is coupled to the output end of the output amplifier, and a cathode of the diode is coupled to the first input end of the output amplifier.

In an embodiment of the invention, the first diode device includes a diode. A cathode of the diode is coupled to the output end of the output amplifier, and an anode of the diode is coupled to the first input end of the output amplifier.

In an embodiment of the invention, the first diode device includes a plurality of diodes, and the diodes are coupled to each other in series to form a diode string. The anode of the diode string is coupled to the output end of the output amplifier, and a cathode of the diode string is coupled to the first input end of the output amplifier.

In an embodiment of the invention, the first diode device includes a plurality of diodes, and the diodes are coupled to each other in series to form a diode string. The anode of the diode string is coupled to the first input end of the output amplifier, and a cathode of the diode string is coupled to the output end of the output amplifier.

In an embodiment of the invention, the first diode device includes a diode and a variable resistor. A first end of the variable resistor is coupled to a first end of the diode. A second end of the diode serves as one of the first and the second ends of the first diode device, and a second end of the variable resistor serves as the other one of the first and the second ends of the first diode device.

In an embodiment of the invention, the first diode device includes a plurality of diodes and a variable resistor. The diodes are coupled to each other in series to form a diode string. A first end of the variable resistor is coupled to a first end of the diode string. A second end of the diode string serves as one of the first and the second ends of the first diode device, and a second end of the variable resistor serves as the other one of the first and the second ends of the first diode device.

In an embodiment of the invention, the first diode device includes a first diode, a second diode, and a variable resistor. A first end of the variable resistor is coupled to a first end of the first diode, and a second end of the variable resistor is coupled to a first end of the second diode. Herein, a second end of the first diode serves as one of the first and the second ends of the first diode device, and a second end of the second diode serves as the other one of the first and the second ends of the first diode device.

In an embodiment of the invention, the amplifier circuit further includes a second diode device. A first end of the second diode device is coupled to the output end of the output amplifier, and a second end of the second diode device is coupled to the second input end of the output amplifier.

In an embodiment of the invention, the amplifier circuit is an operational amplifier. The input amplifier is an input stage of the operational amplifier, and the output amplifier is an output stage of the operational amplifier.

In an embodiment of the invention, the output amplifier includes a first transistor and a second transistor. A first end of the first transistor is coupled to a system voltage, and a second end of the first transistor is coupled to the output end of the output amplifier. Furthermore, a control end of the first transistor serves as the first input end of the output amplifier. A first end of the second transistor is coupled to a ground voltage, and a second end of the second transistor is coupled to the output end of the output amplifier. Furthermore, a control end of the second transistor serves as the second input end of the output amplifier.

Based on the above, in the amplifier circuit of the embodiment of the invention, the diode device is used to detect the voltage difference between the output end and the input end of the output amplifier. When the voltage difference between the output and the input ends of the output amplifier is greater then the barrier voltage of the diode device, the diode device is turned on, so that the output end of the output amplifier is coupled to the input end of the output amplifier. Accordingly, in the transient state, it can rapidly smooth the output signal with overshoot. In the steady state, because the voltage difference between the output and the input ends of the output amplifier is less then the barrier voltage of the diode device, the diode device is cut off to maintain the normal operation of the operational amplifier.

To make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
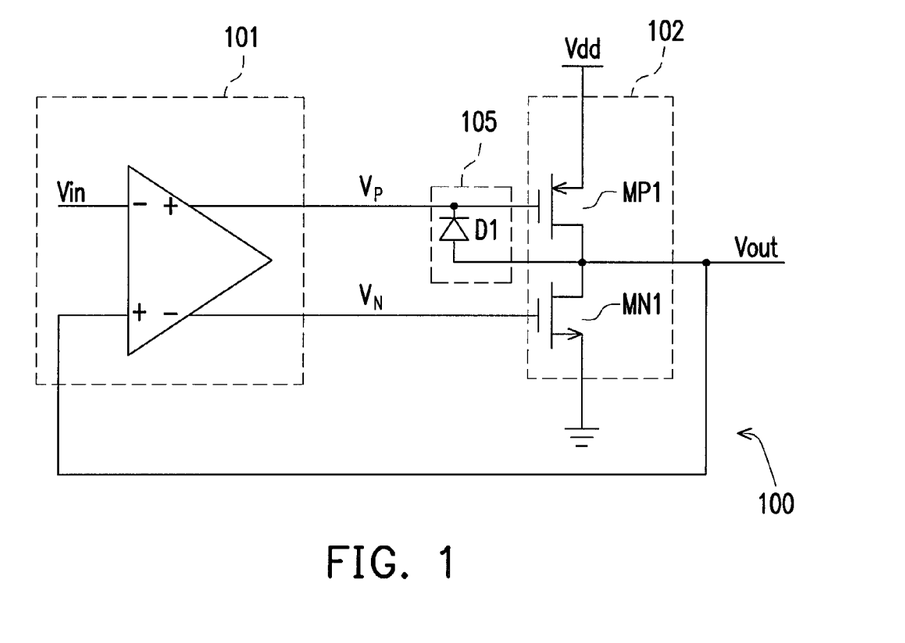
FIG. 1 is a schematic view of an amplifier circuit with the overshoot suppress scheme according to the first embodiment of the invention.

FIG. 1 is a schematic view of an amplifier circuit with an overshoot suppress scheme according to the first embodiment of the invention. Referring to FIG. 1, the amplifier circuit 100 includes an input amplifier 101, an output amplifier 102, and a first diode device 105. In the present embodiment, the input amplifier 101 has a first input end, a second input end, and a differential output pair. The output amplifier 102 has a first input end, a second input end, and an output end. The first and the second input ends of the output amplifier 102 are respectively coupled to the differential output pair of the input amplifier 101, and the output end of the output amplifier 102 provides the output voltage Vout.

A first end of the first diode device 105 is coupled to the output end of the output amplifier 102, and a second end of the first diode device 105 is coupled to the first input end of the output amplifier 102. When a voltage difference between the output end of the output amplifier 102 and the first input end of the output amplifier 102 is greater than a barrier voltage of the first diode device 105, the first diode device 105 is turned on.

The first input end of the input amplifier 101 receives the input voltage Vin. Those who use the present embodiment can freely couple the second input end of the input amplifier 101 directly or indirectly to the output end of the output amplifier 102 to form a feedback as required. In some embodiments, the second input end of the input amplifier 101 may be decoupled to the output end of the output amplifier 102. In the present embodiment, the first input end of the input amplifier 101 is an inverting input end, and the second input end of the input amplifier 101 is a non-inverting input end.

In the present embodiment, the amplifier circuit 100 may be an operational amplifier (OPA), wherein the input amplifier 101 is an input stage of the operational amplifier, and the output amplifier 102 is an output stage of the operational amplifier. The output amplifier 102 includes a first transistor and a second transistor. Herein, a p-channel metal oxide semiconductor field-effect transistor (PMOSFET) MP1 is used to implement the first transistor, and an n-channel metal oxide semiconductor field-effect transistor (NMOSFET) MN1 is used to implement the second transistor. The first end of the PMOSFET MP1 (e.g. the source) is coupled the first voltage (e.g. the system voltage Vdd), and the second end of the PMOSFET MP1 (e.g. the drain) serves as the output end of the output amplifier 102. The control end of the PMOSFET MP1 (e.g. the gate) serves as the first input end of the output amplifier 102. That is, the gate of the transistor MP1 is coupled to one end of the differential output pair of the input amplifier 101 to receive the voltage Vp. The first end of the NMOSFET MN1 (e.g. the source) is coupled the second voltage (e.g. the ground voltage), and the second end of the NMOSFET MN1 (e.g. the drain) is coupled to the drain of the transistor MP1. The control end of the NMOSFET MN1 (e.g. the gate) serves as the second input end of the output amplifier 102. That is, the gate of the transistor MN1 is coupled to the other end of the differential output pair of the input amplifier 101 to receive the voltage Vn.

Herein, the barrier voltage of the first diode device 105 is supposed as Vt. In the present embodiment, the first diode device 105 is a diode D1, and thus, the barrier voltage Vt is the forward bias voltage of the diode D1. An anode of the diode D1 is coupled to the output end of the output amplifier 102, and a cathode of the diode D1 is coupled to the first input end of the output amplifier 102.

In the present embodiment, the single diode D1 is used to implement the first diode device 105, but the implementation of the first diode device 105 is not limited thereto. In other embodiments, the first diode device 105 may be formed by coupling a plurality of diodes to each other in series, and the number of the diodes coupled in series and the amount of the barrier voltage can be freely decided based on the requirement and the normal rated standards. If the back load of the output end of the amplifier circuit is larger, or it is desired to more slowly turn on or cut off the first diode device 105, the plurality of diodes coupled in series are needed. On the contrary, if the back load of the output end of the amplifier circuit is smaller or is a capacitor, in order to rapidly finish the transmission of signals, the less number of the diodes coupled in series are needed to speed up the transmission for signals. In this case, the first diode device 105 is integrated in the amplifier circuit 100 to prevent the overshoot without affecting the normal operation of the amplifier circuit 100.

In following, the operation and mechanism of the amplifier circuit 100 will be described. Herein, it is supposed that the system voltage Vdd is 10 voltages (V), the ground voltage is 0V, and the barrier voltage Vt of the first diode device 105 is 1V. In an ideal situation, when the voltage of the differential output pair of the input amplifier 101 is 8.9V, the output end of the output amplifier 102 correspondingly outputs the output voltage with 9.8V.

Actually, the output voltage overshoots in the transient state when the voltage levels are changed. When the overshoot occurs, the differential output voltages Vp and Vn of the differential output pair of the input amplifier 101 and the output voltage Vout of the output amplifier 102 are in the transient state when the voltage levels are changed. The overshoot temporarily causes the voltage Vp is over low, and the output voltage Vout is over high, and even higher than the system voltage Vdd. When the voltage difference between the output voltage Vout of the output amplifier 102 and the voltage Vp is greater than the barrier voltage Vt of the first diode device 105, the first diode device 105 is turned on, so that the output end of the output amplifier 102 is electrically connected to the first input end of the output amplifier 102. Accordingly, the overshoot current of the output voltage Vout is conducted to the gate of the PMOSFET MP1 in the output amplifier 102, thereby immediately pulling up the gate voltage of the PMOSFET MP1 (i.e. the voltage Vp) to suppress/improve the effect due to overshoot.

In the steady state, the differential output end of the input amplifier 101 and the output end of the output amplifier 102 have no overshoot. Based on the above, in the steady state, the voltage Vp of the differential output pair of the input amplifier 101 is stabilized at 8.9V, so that the output end of the output amplifier 102 correspondingly outputs the output voltage with 9.8V. Because the voltage difference between the output end of the output amplifier 102 and the voltage Vp (i.e. 9.8V−8.9V=0.9V) is less than the barrier voltage Vt of the first diode device 105, the first diode device 105 is cut off. Accordingly, the first diode device 105 does not affect the normal operation of the amplifier circuit 100 in the steady state.

Figure 2:
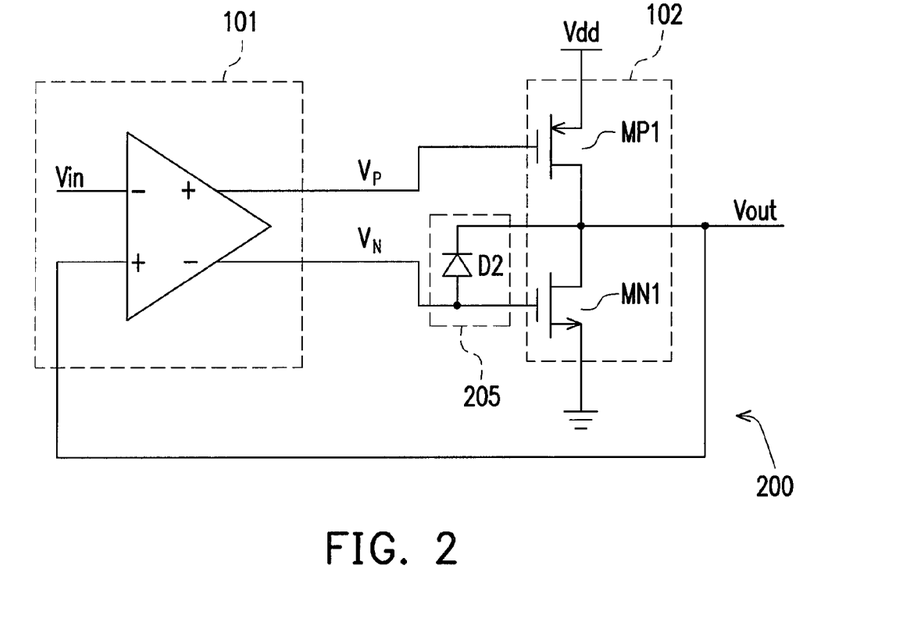
FIG. 2 is a schematic view of an amplifier circuit with the overshoot suppress scheme according to the second embodiment of the invention.

Herein, another embodiment of the invention is provided. FIG. 2 is a schematic view of an amplifier circuit 200 with the overshoot suppress scheme according to the second embodiment of the invention. Referring to FIG. 2, the implementation of the amplifier circuit 200 can refer to the illustration of the amplifier circuit 100, and thus, the same illustration will not be described again. In the second embodiment, the difference between the amplifier circuits 200 and 100 lies in that, in the output amplifier 102 of the amplifier circuit 200, the NMOSFET MN1 is used to implement the first transistor, and the source of the NMOSFET MN1 is coupled to the first voltage (e.g. the ground voltage). Furthermore, the PMOSFET MP1 is used to implement the second transistor, and the source of the PMOSFET MP1 is coupled to the second voltage (e.g. the system voltage). That is, the first end of the first diode device 205 is coupled to the output end of the output amplifier 102 (i.e. the drain of the NMOSFET MN1), and the second end of the first diode device 205 is coupled to the first input end of the output amplifier 102 (i.e. the gate of the NMOSFET MN1).

Referring to FIG. 2, in the present embodiment, the first diode device 205 is a diode D2, and the anode of the diode D2 is coupled to the second input end of the output amplifier 102 to receive voltage Vn. The cathode of the diode D2 is coupled to the output end of the output amplifier 102. The barrier voltage Vt of the first diode device 205 is the forward bias voltage of the diode D2. In the present embodiment, the single diode D2 is used to implement the first diode device 205, but the implementation of the first diode device 205 is not limited thereto. In other embodiments, the implementation of the first diode device 205 is similar to that of the first diode device 105 in the amplifier circuit 100. Accordingly, the first diode device 205 may be formed by coupling a plurality of diodes to each other in series, and the number of the diodes coupled in series and the amount of the barrier voltage can be freely decided based on the requirement and the normal rated standards.

In following, the operation and mechanism of the amplifier circuit 200 will be described. In the present embodiment, it is supposed that the parameters are the same as those in the first embodiment. In an ideal situation, when the voltage Vn of the differential output pair of the input amplifier 101 (i.e. the gate voltage of the transistor MN1) is 1.1V, the output end of the output amplifier 102 correspondingly outputs the output voltage Vout with 0.2V. However, the output voltage actually also overshoots in the transient state when the voltage levels are changed. When the overshoot occurs, the differential output voltages Vp and Vn of the differential output pair of the input amplifier 101 and the output voltage Vout of the output amplifier 102 are in the transient state when the voltage levels are changed. The overshoot temporarily causes the voltage Vn is over high, and the output voltage Vout is over low, and even lower than the ground voltage. Accordingly, the voltage difference between the output end of the output amplifier 102 and the voltage Vn is greater than the barrier voltage Vt of the first diode device 205 (e.g. 1V). When Vn−Vout>Vt, the first diode device 205 is turned on, so that the second input end of the output amplifier 102 (i.e. the gate of the NMOSFET MN1) is electrically connected to the output end of the output amplifier 102. Accordingly, the overshoot current of the gate of the NMOSFET MN1 in the output amplifier 102 is conducted to the output end of the input amplifier 101, thereby immediately pulling up the corresponding output voltage Vout to suppress/improve the effect due to overshoot.

In the steady state, the differential output end of the input amplifier 101 and the output end of the output amplifier 102 have no overshoot. That is, the voltage Vn of the differential output pair of the input amplifier 101 is stabilized at 1.1V, so that the output end of the output amplifier 102 correspondingly outputs the output voltage with 0.2V. Because the voltage difference between the output end of the output amplifier 102 and the voltage Vn (i.e. 1.1V−0.2V=0.9V) is less than the barrier voltage Vt of the first diode device 205, the first diode device 205 is cut off. Accordingly, the first diode device 205 does not affect the normal operation of the amplifier circuit 200 in the steady state.

Figure 3:
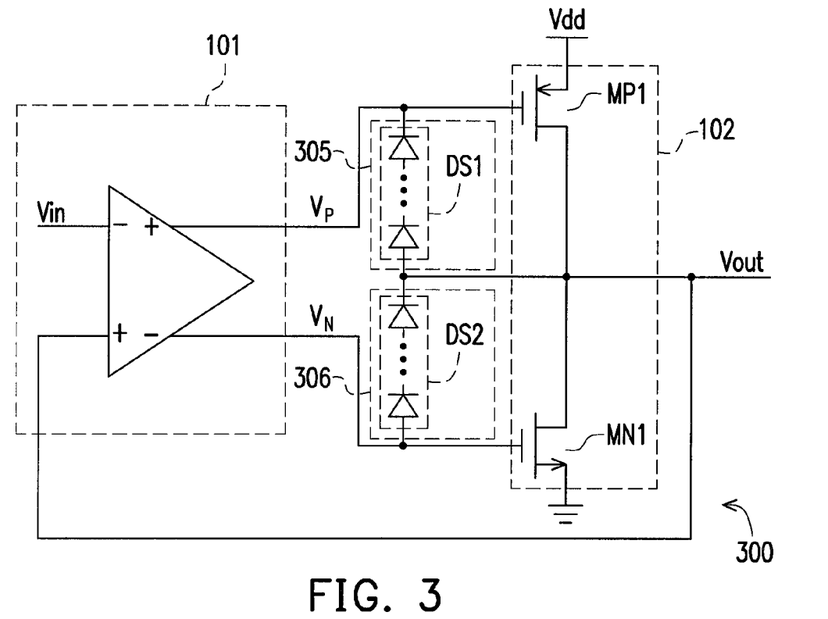
FIG. 3 is a schematic view of an amplifier circuit with the overshoot suppress scheme according to the third embodiment of the invention.

Herein, another embodiment of the invention is provided. FIG. 3 is a schematic view of an amplifier circuit with the overshoot suppress scheme according to the third embodiment of the invention. Referring to FIG. 3, the amplifier circuit 300 with the overshoot suppress scheme is integrated by the amplifier circuits 100 and 200. The implementation of the amplifier circuit 300 can refer to the related illustration of the amplifier circuits 100 and 200. The amplifier circuit 300 has the first diode device 305 and the second diode device 306. The first end of the first diode device 305 is coupled to the output end of the output amplifier 102, and the second end of the first diode device 305 is coupled to the first input end of the output amplifier 102. The first end of the second diode device 306 is coupled to the output end of the output amplifier 102, and the second end of the second diode device 306 is coupled to the second input end of the output amplifier 102.

In the present embodiment, the first diode device 305 includes a plurality of diodes, and the diodes are coupled to each other in series to form a diode string DS1. The diode string DS1 has the barrier voltage Vt1. Herein, the anode of the diode string DS1 serves as the first end of the first diode device 305, and coupled to the output end of the output amplifier 102 to receive the voltage Vout. Furthermore, the cathode of the diode string DS1 serves as the second end of the first diode device 305, and coupled to the first input end of the output amplifier 102 to receive the voltage Vp. The second diode device 306 also includes a plurality of diodes, and the diodes are coupled to each other in series to form a diode string DS2. The diode string DS2 has the barrier voltage Vt2. Herein, the cathode of the diode string DS2 serves as the first end of the second diode device 306, and coupled to the output end of the output amplifier 102. Furthermore, the anode of the diode string DS2 serves as the second end of the second diode device 306, and coupled to the second input end of the output amplifier 102. In the present embodiment, the number of the diodes of the diode string DS1 or DS2 coupled in series and the amount of the barrier voltage Vt1 or Vt2 can be freely decided based on the requirement and the normal rated standards, and it can refer to the related description in the foregoing embodiments.

In some embodiments, the first diode device 305 and the second diode device 306 can be formed by a single diode, respectively. In the output amplifier 102 of the amplifier circuit 300, if the PMOSFET MP1 is used to implement the first transistor, and the NMOSFET MN1 is used to implement the second transistor, the anode of the diode in the first diode device 305 is coupled to the output end of the output amplifier 102 (i.e. the drain of the PMOSFET MP1), and the cathode of the diode is coupled to the first input end of the output amplifier 102 (i.e. the gate of the PMOSFET MP1). The anode of the diode in the second diode device 306 is coupled to the second input end of the output amplifier 102 (i.e. the gate of the NMOSFET MN1), and the cathode of the diode is coupled to the output end of the output amplifier 102 (i.e. the drain of the NMOSFET MN1). In another embodiment, in the output amplifier 102 of the amplifier circuit 300, the NMOSFET MN1 is used to implement the first transistor, and the PMOSFET MP1 is used to implement the second transistor. Accordingly, the anode of the diode in the first diode device 305 is coupled to the first input end of the output amplifier 102 (i.e. the gate of the NMOSFET MN1), and the cathode of the diode is coupled to the output end of the output amplifier 102 (i.e. the drain of the NMOSFET MN1). The anode of the diode in the second diode device 306 is coupled to the output end of the output amplifier 102 (i.e. the drain of the PMOSFET MP1), and the cathode of the diode is coupled to the second input end of the output amplifier 102 (i.e. the gate of the PMOSFET MP1).

The operation and mechanism of the amplifier circuit 300 can refer to the related illustration of the amplifier circuits 100 and 200. Based on the description in the present embodiment, in the transient state when the voltage levels are changed, the overshoot temporarily causes the voltage Vp is over low, and the output voltage Vout is over high. When the voltage difference between the output voltage Vout of the output amplifier 102 and the voltage Vp is greater than the barrier voltage Vt1 of the first diode device 305, the first diode device 305 is turned on, so that the overshoot current of the output end of the output amplifier 102 is conducted to the gate of the PMOSFET MP1 in the output amplifier 102, thereby immediately pulling up the gate voltage of the PMOSFET MP1 (i.e. the voltage Vp). Similarly, the overshoot temporarily may cause the voltage Vn is over high, and the output voltage Vout is over low. When the voltage difference between the output voltage Vout of the output amplifier 102 and the voltage Vn is greater than the barrier voltage Vt2 of the second diode device 306, the second diode device 306 is turned on, so that the overshoot current of the gate of the NMOSFET MN1 is conducted to the output end of the output amplifier 102, thereby immediately pulling up the output voltage Vout to suppress/improve the effect for the voltages Vp and Vn and the output voltage Vout due to overshoot. In the steady state, the voltages Vp and Vn and the output voltage Vout have no overshoot, and the first diode device 305 and the second diode device 306 are both cut off. Accordingly, the first diode device 305 and the second diode device 306 do not affect the normal operation of the amplifier circuit 300 in the steady state.

Figure 4:
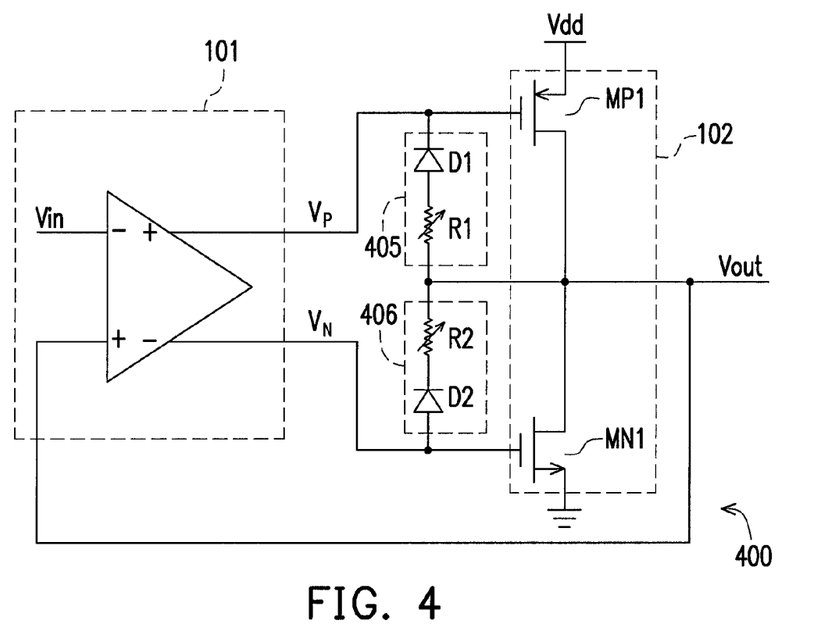
FIG. 4 is a schematic view of an amplifier circuit with the overshoot suppress scheme according to the fourth embodiment of the invention.

Those who use the present embodiment can add a variable resistor to the diode device to increase the barrier voltage of the diode device as shown in FIG. 4. FIG. 4 is a schematic view of an amplifier circuit with the overshoot suppress scheme according to the fourth embodiment of the invention. Referring to FIG. 4, the implementation of the amplifier circuit 400 can refer to the related illustration of the amplifier circuit 300. The difference of the amplifier circuits 400 and 300 lies in that, a variable resistor is added to each of the first diode device 405 and the second diode device 406. The first diode device has a diode D1 and a variable resistor R1. The first end of the variable resistor R1 is coupled to the first end of the diode D1, the second end of the diode serves as one of the first and the second ends of the first diode device 405, and the second end of the variable resistor serves as the other one of the first and the second ends of the first diode device 405. The connection of the diode D2 and the variable resistor R2 in the second diode device 406 is the same as that in the first diode device 405.

In the present embodiment, in the first diode device 405, the first end of the variable resistor R1 is coupled to the anode of the diode D1, and the cathode of the diode D1 is coupled to the first input end of the output amplifier 102. Furthermore, the second end of the variable resistor R1 is coupled to the output end of the output amplifier 102. In the first diode device 406, the first end of the variable resistor R2 is coupled to the output end of the output amplifier 102, and the second end of the variable resistor R2 is coupled to the cathode of the diode D2. Furthermore, the anode of the diode D2 is coupled to the second input end of the output amplifier 102.

Because the variable resistor has no polarity, those who use the present embodiment can freely change the series order of the variable resistor and the diode as required, and it does not change the operation of the amplifier circuit in the present embodiment. In other embodiments, in the first diode device 405, the first end of the variable resistor R1 can be first coupled to the first input end of the output amplifier 102 to receive the voltage Vp, and the second end of the variable resistor R1 and the cathode of the diode D1 are electrically connected. Furthermore, the anode of the diode D1 is coupled to the output end of the output amplifier 102. Similar to that in the first diode device 405, the series order of the diode D2 and the variable resistor R2 can be changed in the second diode device 406.

The variable resistors R1 and R2 are mainly used to increase the barrier voltages Vt1 and Vt2 of the first diode device 405 and the second diode device 406. Also, by increasing or decreasing the resistances of the variable resistors R1 and R2, the current passing through the first diode device 405 and the second diode device 406 is limited. Accordingly, the variable resistors R1 and R2 serve as current limiters. Compared with the other embodiments, it can increase the barrier voltage of the diode device to increase the resistance of the variable resistor and to increase the number of the diodes coupled in series. However, when the overshoot occurs, the variable resistor does not increase the period of the transient when the voltage levels are changed, but the variable resistor can rapidly response to the overshoot. When the number of the diodes coupled in series is changed, the period of the transient when the voltage levels are changed is correspondingly increased/decreased according to the number of the diodes coupled in series. Accordingly, those who use the present embodiment can freely change the number of the diodes coupled in series as required.

Figure 5A:
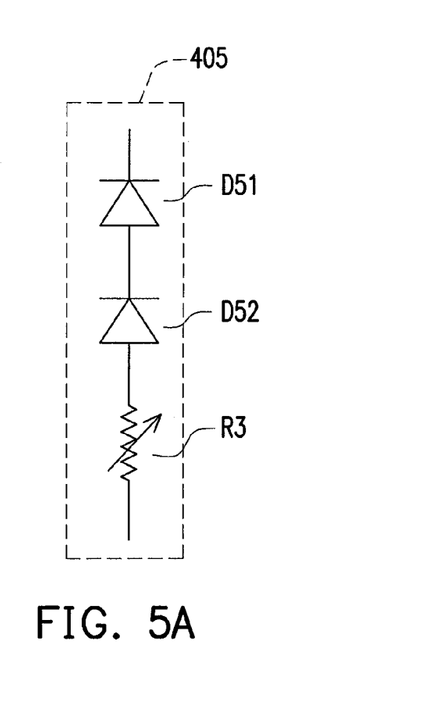
FIG. 5A, FIG. 5B, and FIG. 5C are schematic views illustrating other embodiments of the first diode device in FIG. 4.
Figure 5B:
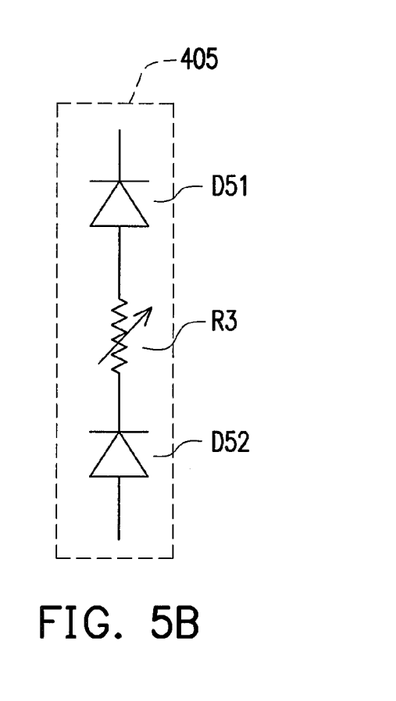
Figure 5C:
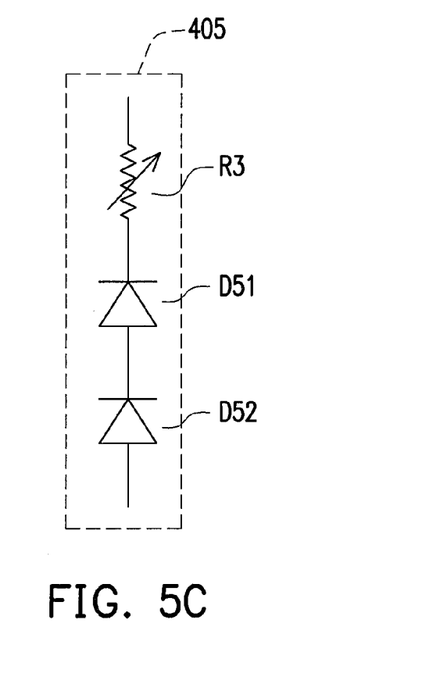

Other applications of the diode device in the present embodiment are shown in FIG. 5. FIG. 5A, FIG. 5B, and FIG. 5C are schematic views illustrating other embodiments of the first diode device 405 in FIG. 4. In following, the embodiment is exemplary by replacing the first diode device 405 in FIG. 4 with the first diode devices 405 in FIG. 5A, FIG. 5B, and FIG. 5C, respectively, and the second diode device 406 can also be implemented by referring to FIG. 5A, FIG. 5B, and FIG. 5C.

In the present embodiment, the first diode devices 405 of FIG. 5A, FIG. 5B, and FIG. 5C respectively include a first diode D51, a second diode D52, and a variable resistor R3. In FIG. 5A and FIG. 5C, the diodes D51 and D52 are coupled to each other in series to form a diode string. The first end of the variable resistor R3 is coupled to the first end of the diode string, and the second end of the diode string serves as the first end or the second end of the first diode device 405. The second end of the variable resistor R3 serves as the other end of the first diode device 405. As a result, the first diode device 405 in FIG. 4 is replaced with the first diode device 405 in FIG. 5A or FIG. 5C. In FIG. 5B, the first end of the variable resistor R3 is coupled to the first end of the first diode D51, and the second end of the variable resistor R3 is coupled to the first end of the second diode D52. Herein, the second end of the first diode D51 serves as one of the first and the second ends of the first diode device 405, and the second end of the second diode D52 serves as the other end of the first diode device 405. As a result, the first diode device 405 in FIG. 4 is replaced with the first diode device 405 in FIG. 5B. In the present embodiment, the series order of the first diode D51, the second diode D52, and the variable resistor R3 can be freely changed as that in FIG. 5A, FIG. 5B, or FIG. 5C as required, and the invention is not limited thereto. In other applications of the present embodiment, the first diode D51 and the second diode D52 may be diode strings formed by one or more than one diodes.

Figure 6A:
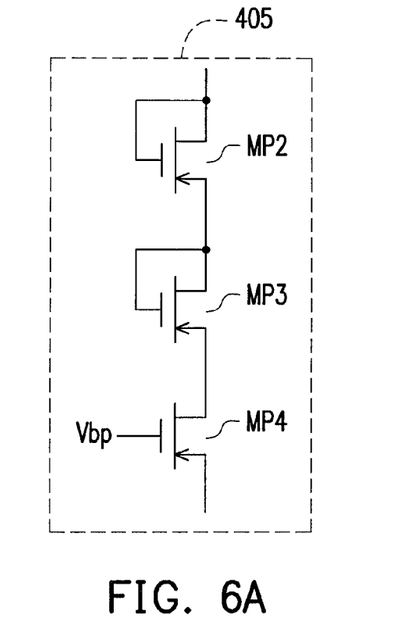
FIG. 6A, FIG. 6B, and FIG. 6C are schematic views respectively illustrating other embodiments of the first diode device in FIG. 5A, FIG. 5B, and FIG. 5C.
Figure 6B:
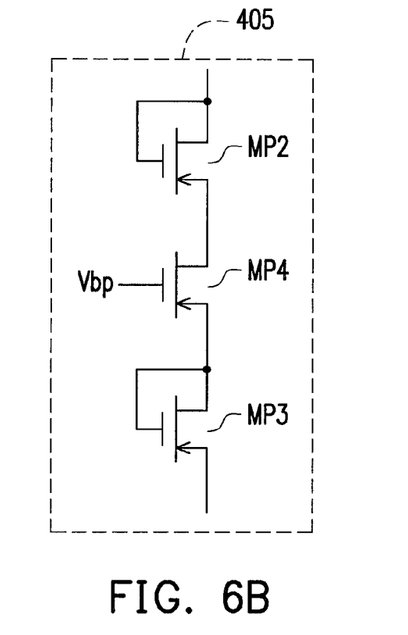
Figure 6C:
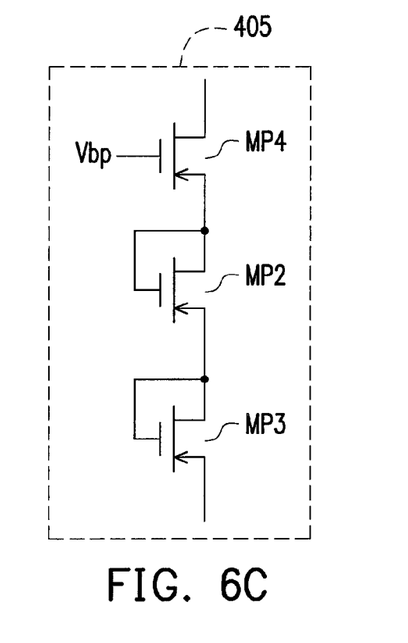

In the foregoing embodiments, the first diode device 405 or the second diode device 406 can also be implemented by MOSFET. By using MOSFET, the diode device can be integrated in the integrated circuit to reduce the circuit area and the cost. FIG. 6A, FIG. 6B, and FIG. 6C are schematic views respectively illustrating other embodiments of the first diode device 405 in FIG. 5A, FIG. 5B, and FIG. 5C. In the present embodiment, the PMOSFETs are used to implement the first diode device 405. In the present embodiment, the first diode D51, the second diode D52, and the variable resistor R3 in FIG. 5A, FIG. 5B, and FIG. 5C respectively correspond to the PMOSFETs MP2, MP3, and MP4 in FIG. 6A, FIG. 6B, and FIG. 6C The drain and the gate of each of the PMOSFETs MP2 and MP3 are connected together, and the drains and the sources of the PMOSFETs MP2 and MP3 respectively serve as the anode and the cathode of the diode. Accordingly, the first diode D51 and the second diode D52 in FIG. 5 are formed. The gate of the transistor MP4 is connected to the bias voltage Vbp, and the source and the drain of the PMOSFET MP4 serves as the two end of the variable resistor, so that the transistor MP4 is formed as the variable resistor R3. Accordingly, the bias voltage Vbp can be used to adjust the amount of the resistance, thereby increasing the barrier voltage Vt1 of the first diode device 405 and serving as the current limiter.

Figure 6D:
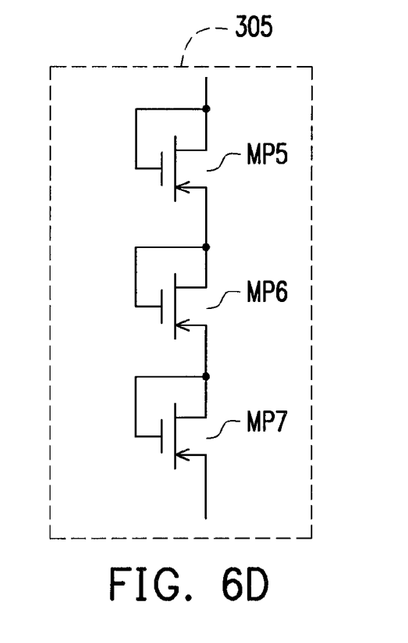
FIG. 6D is a schematic view illustrating another embodiment of the first diode device in FIG. 3.

Moreover, FIG. 6D is a schematic view illustrating another embodiment of the first diode device 305 in FIG. 3. In the present embodiment, the drain and the gate of each of the transistors MP5, MP6, and MP7 in the first diode device 305 are connected together. Furthermore, the drain of each of the transistors MP5, MP6, and MP7 serves as the cathode of the diode, and the source of each of the transistors MP5, MP6, and MP7 serves as the anode of the diode. According, three diodes are formed. These diodes are coupled to each other in series to form a diode string, and the implementation of the diode string is similar to that of the first diode device 305 in FIG. 3, which is formed by coupling three diodes in series. It can refer to the related illustration of the amplifier circuit 300.

Figure 7A:
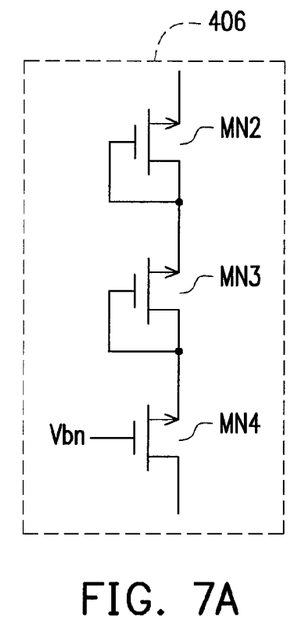
FIG. 7A, FIG. 7B, and FIG. 7C are schematic views illustrating other embodiments of the second diode device in FIG. 4.
Figure 7B:
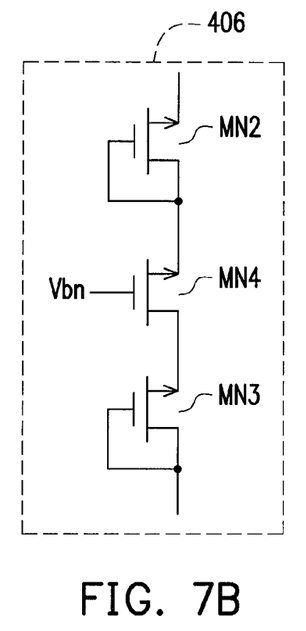
Figure 7C:
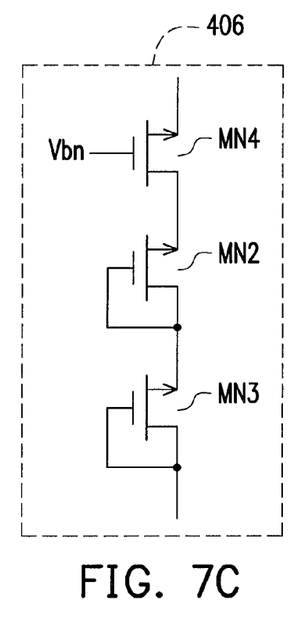

FIG. 7A, FIG. 7B, and FIG. 7C are schematic views illustrating other embodiments of the second diode device 406 in FIG. 4. The first diode device 405 can also be implemented by referring FIG. 7A, FIG. 7B, and FIG. 7C. In the present embodiment, the NMOSFETs are used to implement the second diode device 406. In the present embodiment, the NMOSFETs MN2 and MN3 in FIG. 7A, FIG. 7B, and FIG. 7C are used as the diodes, and the NMOSFET MN4 is used as the variable resistor. The drain and the gate of each of the PMOSFET MP2 and the PMOSFET MP3 are also connected together, and the drains and the sources of the PMOSFETs MP2 and MP3 respectively serve as the cathode and the anode of the diode. The gate of the transistor MN4 is connected to the bias voltage Vbn, and the source and the drain of the PMOSFET MP4 serves as the two end of the variable resistor. Furthermore, the bias voltage Vbn can be used to adjust the amount of the resistance.

Figure 7D:
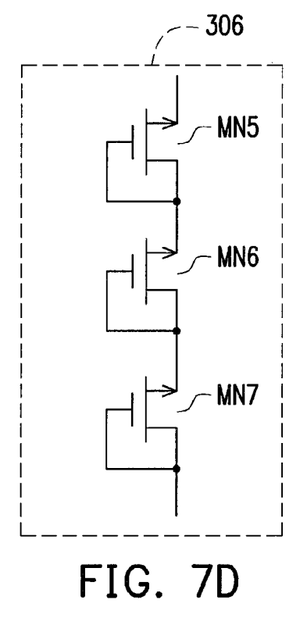
FIG. 7D is a schematic view illustrating another embodiment of the second diode device in FIG. 3.

Moreover, FIG. 7D is a schematic view illustrating another embodiment of the second diode device 306 in FIG. 3. Similar to that in FIG. 6, the drain and the gate of each of the transistors MP5, MP6, and MP7 in the first diode device 306 are connected together. Furthermore, the drain and the source of each of the transistors MP5, MP6, and MP7 respectively serve as the cathode and the anode of the diode. According, three diodes are formed. These diodes are coupled to each other in series to form a diode string, and the implementation of the diode string is similar to that of the second diode device 306 in FIG. 3, which is formed by coupling three diodes in series. It can refer to the related illustration of the amplifier circuit 300.

To sum up, in the amplifier circuit of the embodiment of the invention, the diode device is used to detect the voltage difference between the output end and the input end of the output amplifier. When the voltage difference between the output and the input ends of the output amplifier is greater then the barrier voltage of the diode device, the diode device is turned on, so that the output end of the output amplifier is coupled to the input end of the output amplifier. In the transient state, the overshoot occurs in the output voltage Vout during the period of the transient state when the voltage levels are changed, and by using the diode device, the overshoot current of the output voltage Vout is conducted to the differential output end of the input amplifier, thereby immediately pulling up the differential output end of the input amplifier to suppress/improve the effect due to overshoot.

In the steady state, because the voltage difference between the output and the input ends of the output amplifier is less then the barrier voltage of the diode device, the diode device is cut off to maintain the normal operation of the operational amplifier. The diode device can includes the variable resistor to increase the barrier voltage of the diode device. Furthermore, comparing the method of adding the variable resistor and the method of increasing the number of the diodes coupled in series, both of them can increase the barrier voltage of the diode device, but the method of adding the variable resistor can not increase the transient period when the voltage levels are changed. By increasing or decreasing the resistance, the variable resistor can limit the current passing through the diode device to serve as the current limiter. The amplifier circuit can also be integrated in the integrated circuit to reduce the circuit area and the cost.

Although the invention has been described with reference to the above embodiments, it is apparent to one of the ordinary skill in the art that modifications to the described embodiments may be made without departing from the spirit of the invention. Accordingly, the scope of the invention will be defined by the attached claims not by the above detailed descriptions.

What is claimed is:

1. An amplifier circuit, comprising:
   an input amplifier having a first input end, a second input end, and a differential output pair;
   an output amplifier having a first input end, a second input end, and an output end, and the first and the second input ends of the output amplifier coupled to the differential output pair of the input amplifier; and
   a first diode device coupled between the output end of the output amplifier and the first input end of the output amplifier, wherein when a voltage difference between the output end of the output amplifier and the first input end of the output amplifier is greater than a barrier voltage of the first diode device, the first diode device is turned on.

2. The amplifier circuit as claimed in claim 1, wherein the first diode device comprises a diode, an anode of the diode is coupled to the output end of the output amplifier, and a cathode of the diode is coupled to the first input end of the output amplifier.

3. The amplifier circuit as claimed in claim 1, wherein the first diode device comprises a diode, an anode of the diode is coupled to the first input end of the output amplifier, and a cathode of the diode is coupled to the output end of the output amplifier.

4. The amplifier circuit as claimed in claim 1, wherein the first diode device comprises a plurality of diodes, the diodes are coupled to each other in series to form a diode string, an anode of the diode string is coupled to the first input end of the output amplifier, and a cathode of the diode string is coupled to the output end of the output amplifier.

5. The amplifier circuit as claimed in claim 1, wherein the first diode device comprises a plurality of diodes, the diodes are coupled to each other in series to form a diode string, an anode of the diode string is coupled to the output end of the output amplifier, and a cathode of the diode string is coupled to the first input end of the output amplifier.

6. The amplifier circuit as claimed in claim 1, wherein the first diode device comprises:
   a diode; and
   a variable resistor, a first end of the variable resistor coupled to a first end of the diode, a second end of the diode serving as one of the first and the second ends of the first diode device, and a second end of the variable resistor serving as the other one of the first and the second ends of the first diode device.

7. The amplifier circuit as claimed in claim 1, wherein the first diode device comprises:
   a plurality of diodes coupled to each other in series to form a diode string; and
   a variable resistor, a first end of the variable resistor coupled to a first end of the diode string, a second end of the diode string serving as one of the first and the second ends of the first diode device, and a second end of the variable resistor serving as the other one of the first and the second ends of the first diode device.

8. The amplifier circuit as claimed in claim 1, wherein the first diode device comprises:
   a first diode;
   a second diode; and
   a variable resistor, a first end of the variable resistor coupled to a first end of the first diode, a second end of the variable resistor coupled to a first end of the second diode, a second end of the first diode serving as one of the first and the second ends of the first diode device, and a second end of the second diode serving as the other one of the first and the second ends of the first diode device.

9. The amplifier circuit as claimed in claim 1, further comprising a second diode device, a first end of the second diode device coupled to the output end of the output amplifier, and a second end of the second diode device is coupled to the second input end of the output amplifier.

10. The amplifier circuit as claimed in claim 9, wherein the second diode device comprises a diode, an anode of the diode is coupled to the output end of the output amplifier, and a cathode of the diode is coupled to the second input end of the output amplifier.

11. The amplifier circuit as claimed in claim 9, wherein the second diode device comprises a diode, an anode of the diode is coupled to the second input end of the output amplifier, and a cathode of the diode is coupled to the output end of the output amplifier.

12. The amplifier circuit as claimed in claim 9, wherein the second diode device comprises a plurality of diodes, the diodes are coupled to each other in series to form a diode string, an anode of the diode string is coupled to the second input end of the output amplifier, and a cathode of the diode string is coupled to the output end of the output amplifier.

13. The amplifier circuit as claimed in claim 9, wherein the second diode device comprises:
   a diode; and
   a variable resistor, a first end of the variable resistor coupled to a first end of the diode, a second end of the diode serving as one of the first and the second ends of the second diode device, and a second end of the variable resistor serving as the other one of the first and the second ends of the second diode device.

14. The amplifier circuit as claimed in claim 9, wherein the second diode device comprises:
   a plurality of diodes coupled to each other in series to form a diode string; and
   a variable resistor, a first end of the variable resistor coupled to a first end of the diode string, a second end of the diode string serving as one of the first and the second ends of the second diode device, and a second end of the variable resistor serving as the other one of the first and the second ends of the second diode device.

15. The amplifier circuit as claimed in claim 9, wherein the second diode device comprises:
   a first diode;
   a second diode; and
   a variable resistor, a first end of the variable resistor coupled to a first end of the first diode, a second end of the variable resistor coupled to a first end of the second diode, a second end of the first diode serving as one of the first and the second ends of the second diode device, and a second end of the second diode serving as the other one of the first and the second ends of the second diode device.

16. The amplifier circuit as claimed in claim 1, wherein the amplifier circuit is an operational amplifier, the input amplifier is an input stage of the operational amplifier, and the output amplifier is an output stage of the operational amplifier.

17. The amplifier circuit as claimed in claim 1, wherein the output amplifier comprises:
- a first transistor, a first end of the first transistor coupled to a first voltage, a second end of the first transistor serving as the output end of the output amplifier, and a control end of the first transistor serving as the first input end of the output amplifier; and
- a second transistor, a first end of the second transistor coupled to a second voltage, a second end of the second transistor coupled to the second end of the first transistor, and a control end of the second transistor serving as the second input end of the output amplifier.

18. The amplifier circuit as claimed in claim 17, wherein the first transistor is a p-channel metal oxide semiconductor field-effect transistor, and the second transistor is an n-channel metal oxide semiconductor field-effect transistor.

19. The amplifier circuit as claimed in claim 18, wherein the first voltage is a system voltage, and the second voltage is a ground voltage.

20. The amplifier circuit as claimed in claim 17, wherein the first transistor is an n-channel metal oxide semiconductor field-effect transistor, and the second transistor is a p-channel metal oxide semiconductor field-effect transistor.

21. The amplifier circuit as claimed in claim 20, wherein the first voltage is a ground voltage, and the second voltage is a system voltage.

22. The amplifier circuit as claimed in claim 1, wherein the output end of the output amplifier is coupled to the second input end of the input amplifier.

23. The amplifier circuit as claimed in claim 1, wherein the first input end of the input amplifier is an inverting input end, and the second input end of the input amplifier is a non-inverting input end.

* * * * *